United States Patent [19]
Yew et al.

[11] Patent Number: 6,114,200
[45] Date of Patent: *Sep. 5, 2000

[54] METHOD OF FABRICATING A DYNAMIC RANDOM ACCESS MEMORY DEVICE

[75] Inventors: Tri-Rung Yew, Hsinchu Hsien; Water Lur; Shih-Wei Sun, both of Taipei, all of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/996,697

[22] Filed: Dec. 23, 1997

[30] Foreign Application Priority Data

Jun. 28, 1997 [TW] Taiwan ................................. 86109104

[51] Int. Cl.⁷ ........................ H01L 21/8242; H01L 21/20
[52] U.S. Cl. .......................... 438/253; 438/397; 438/582; 257/303
[58] Field of Search ..................... 438/396, 397, 438/398, 244, 253, 648, 605, FOR 212; 257/306, 751

[56] References Cited

U.S. PATENT DOCUMENTS

| | | | |
|---|---|---|---|
| 5,187,557 | 2/1993 | Zenke | 257/310 |
| 5,279,985 | 1/1994 | Kamiyama | 438/396 |
| 5,622,893 | 4/1997 | Summerfelt et al. | 438/396 |
| 5,879,981 | 3/1999 | Tanigawa | 438/241 |

FOREIGN PATENT DOCUMENTS 06200366  7/1994  Japan .

*Primary Examiner*—Wael Fahmy
*Assistant Examiner*—William David Coleman
*Attorney, Agent, or Firm*—Rabin & Champagne, PC

[57] ABSTRACT

A method of fabricating a DRAM device to reduce the stress and enhance the adhesion between the top electrode and the interlevel dielectric layer, includes forming a titanium layer between the top electrode and the interlevel dielectric layer. A titanium oxide layer and a titanium silicide are formed between the titanium layer and the interlevel dielectric layer in post thermal procedures, which enhances the adhesion and avoids cracks and leakage current between the top electrode and the interlevel dielectric layer.

24 Claims, 3 Drawing Sheets

METHOD OF FABRICATING A DYNAMIC RANDOM ACCESS MEMORY DEVICE

BACKGROUND OF THE INVENTION

1. Field of the Invention

This invention relates to a method of fabricating a dynamic random access memory (DRAM) device, and more particularly to a method of fabricating a DRAM device for reducing the stress between a top electrode of a DRAM capacitor and an interlevel dielectric layer.

2. Description of Related Art

The main purpose of the capacitor in a DRAM device is to save logical data. The capacity in a DRAM device must be large enough, so the data access time can be fast. When the device size scales down, the capacity decreases. It is typical to use a high-k dielectric material for DRAM capacitors. Using the high-k dielectric can increase the capacity in the same thickness of dielectric.

The semiconductor structure configuration of a high-k dielectric material for a conventional DRAM device memory cell unit is shown in the cross-sectional schematic view in FIG. 1. A field oxide layer 11, polygate layer 13, source/drain regions 12 and word line 14 of a MOS transistor 15 are formed over the surface of a silicon substrate 10. After the formation of the transistor 15, an oxide layer 16 is deposited over the surface of the substrate 10. Contact openings 17 are formed at designed locations above the source/drain regions 12 by etching. The contact openings 17 are then filled with a conductive material, such as tungsten, to form plugs 18. A conductive layer 19, such as a heavily doped polysilicon layer, is deposited over the plugs 18 to form a bottom electrode of the capacitor. A dielectric layer 20, such as a tantalum oxide ($Ta_2O_5$) layer, is deposited on the top of the conductive layer 19 and oxide layer 16. A titanium nitride layer 21 is deposited over the dielectric layer 20 to form a top electrode of the capacitor. Then, an interlevel dielectric layer 22, such as a borophosphosilicon glass (BPSG) layer, is formed over the titanium nitride layer 21 to complete the fabrication of the conventional DRAM device.

The titanium nitride layer 21 is used as the top electrode of the DRAM capacitor, while the dielectric layer is a high-k dielectric layer in the above DRAM device. The stress between titanium nitride layer 21 and interlevel dielectric layer 22 of the DRAM capacitor will increase when the temperature is above 600° C. This will cause interlevel dielectric layer 22 to crack, thus increasing leakage current during the following BPSG reflow for planarization.

Thus, to reduce the stress between titanium nitride layer 21 and interlevel dielectric layer 22 and to decrease the crack and the leakage current, a polysilicon layer is formed between the titanium nitride layer 21 and the interlevel dielectric layer 22 to overcome the above problems. Another semiconductor structure configuration of a high-k dielectric material for a conventional DRAM device memory cell unit is shown in the cross-sectional schematic view in FIG. 2. A field oxide layer 31, polygate layer 33, source/drain regions 32 and word line 34 of the MOS transistor 35 are formed over the surface of a silicon substrate 30. After the formation of the transistor 35, an oxide layer 36 is deposited over the surface of the substrate 30. Contact openings 37 are formed at designed locations above the source/drain regions 32 by etching. The contact openings 37 are then filled with a conductive material, such as tungsten, to form plugs 38. A conductive layer 39, such as a heavily doped polysilicon layer, is deposited over the plugs 38, and forms a bottom electrode of the capacitor. A dielectric layer 40, such as a tantalum oxide layer, is deposited on the top of the conductive layer 39 and oxide layer 36. A titanium nitride layer 41 is deposited over the dielectric layer 40 to form a top electrode of the capacitor. Then, a polysilicon layer 42 is deposited over the titanium nitride layer 41. An interlevel dielectric layer 43, such as a borophosphosilicon glass layer, is formed over the titanium nitride layer 41 to complete the fabrication of this conventional DRAM device.

The known methods to form a polysilicon layer between the titanium nitride layer and the interlevel dielectric layer make the fabrication more complex and expensive, though it does reduce crack formation and leakage current.

SUMMARY OF THE INVENTION

It is therefore an object of the present invention to provide a method of fabricating a DRAM device which avoids crack formations and leakage current between the top electrode and the interlevel dielectric layer, by forming a titanium layer between the top electrode and the interlevel dielectric layer.

It is another object of the present invention to provide a method of fabricating the DRAM device, which reduces the stress and enhances the adhesion between the top electrode and the interlevel dielectric layer, by forming a titanium layer between the top electrode and the interlevel dielectric layer.

It is a further object of the present invention to provide a method of fabricating the DRAM device, in which the titanium layer and titanium nitride layer are formed in the same chamber. This reduces the complexity of fabricating the DRAM device and the costs.

The method of fabricating the DRAM device includes: forming a transistor including a gate, a source/drain region and a word line on a silicon substrate. An oxide layer is formed covering the transistor. A contact opening is formed in the oxide layer to expose the surface of the source/drain region. A conductive layer is formed in the contact opening and covering the oxide layer. The conductive layer is patterned to form a plurality of bottom electrodes. The bottom electrodes are coupled with the source/drain region by the contact opening. A dielectric layer is formed over the surface of the bottom electrodes and the oxide layer. A top electrode is formed covering the high-k dielectric layer. A titanium layer is formed on the top electrode. Then, an interlevel dielectric layer is formed on the titanium layer.

BRIEF DESCRIPTION OF THE DRAWINGS

Other objects, features, and advantages of the present invention will become apparent by way of the following detailed description of the preferred but non-limiting embodiment. The description is made with reference to the accompanying drawings in which.

DESCRIPTION OF THE PREFERRED EMBODIMENT

Figure 1:
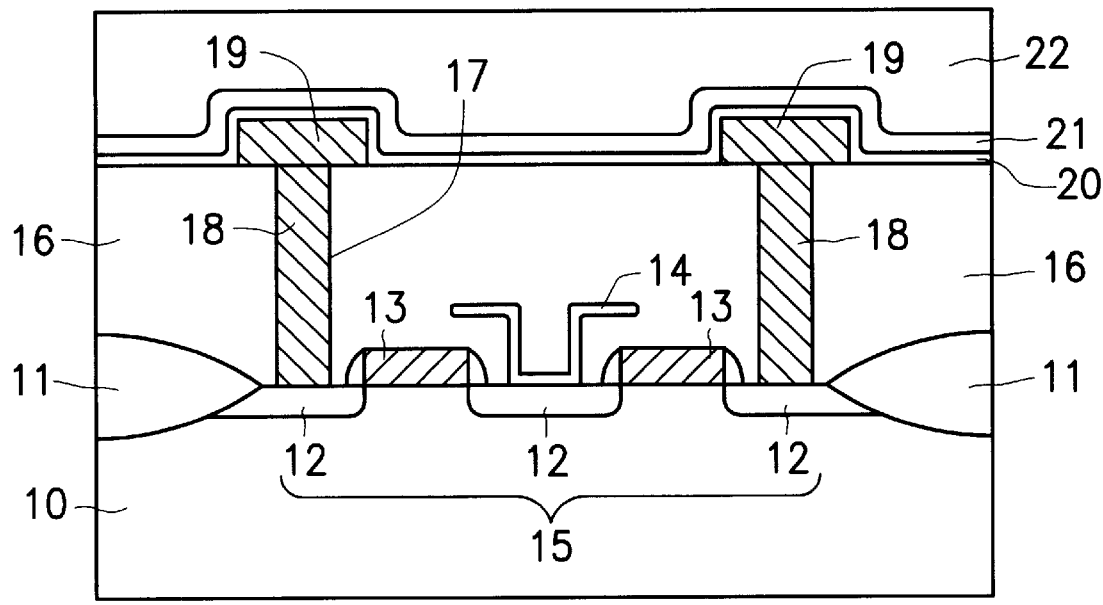
FIG. 1 is a cross-sectional view showing a conventional memory cell unit for a DRAM device.
Figure 2:
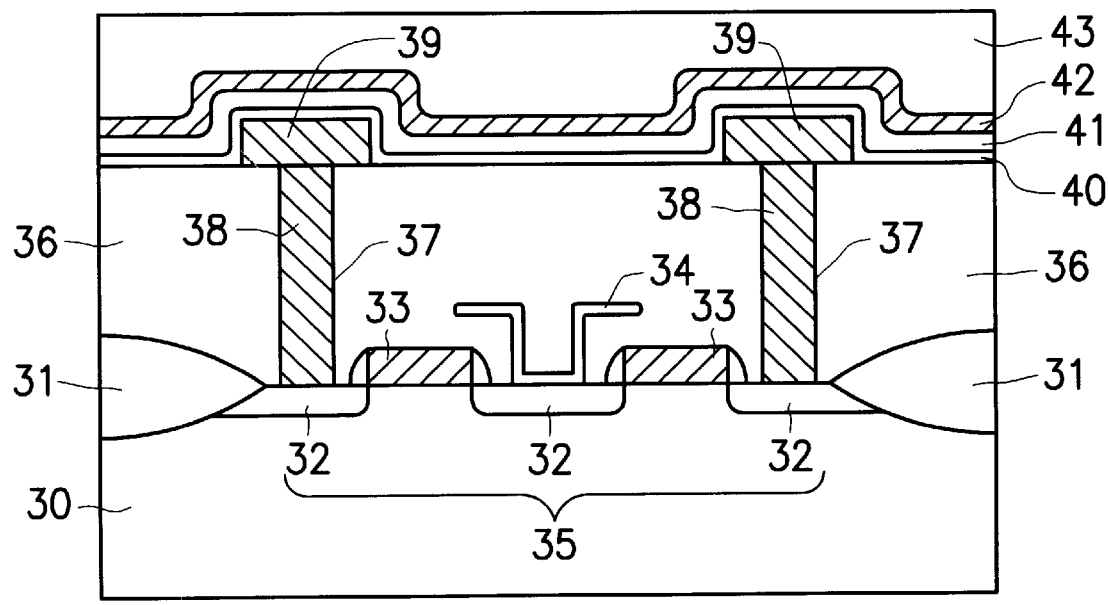
FIG. 2 is a cross-sectional view showing another conventional memory cell unit for a DRAM device.
Figure 3A:
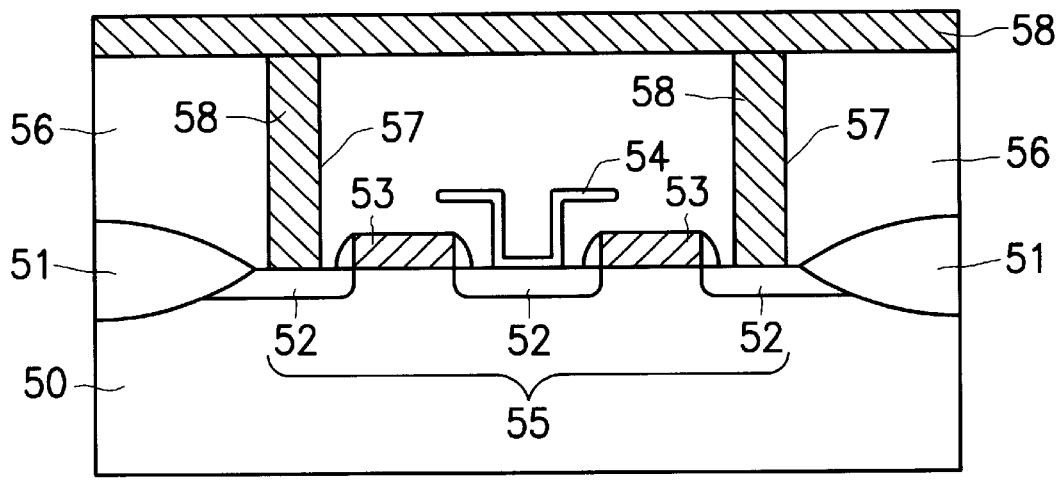
FIGS. 3A–3C show cross-sectional views of a memory cell unit for a DRAM device fabricated in accordance with a preferred embodiment of the invention.
Figure 3B:
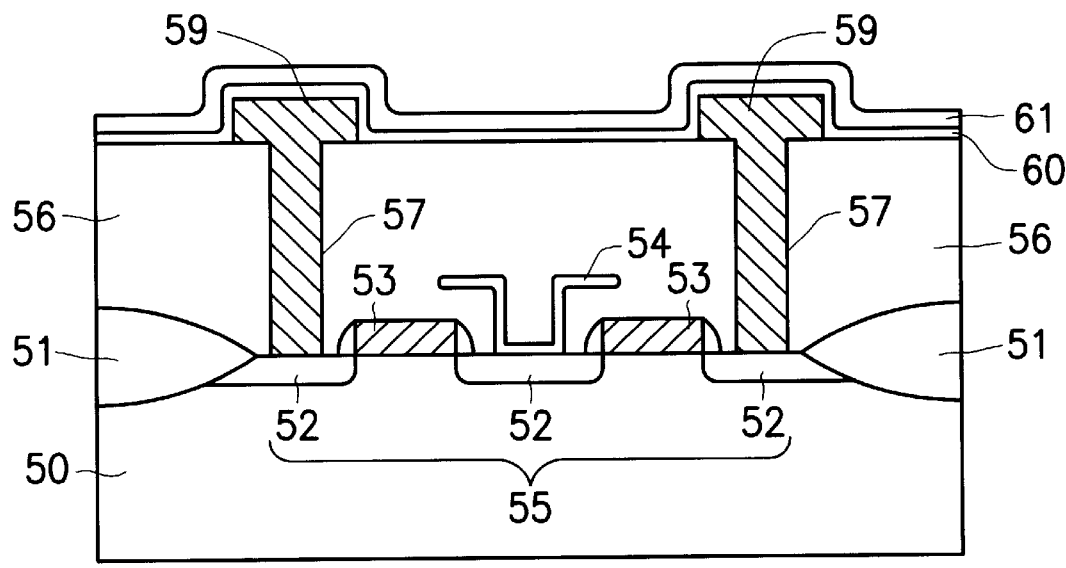
Figure 3C:
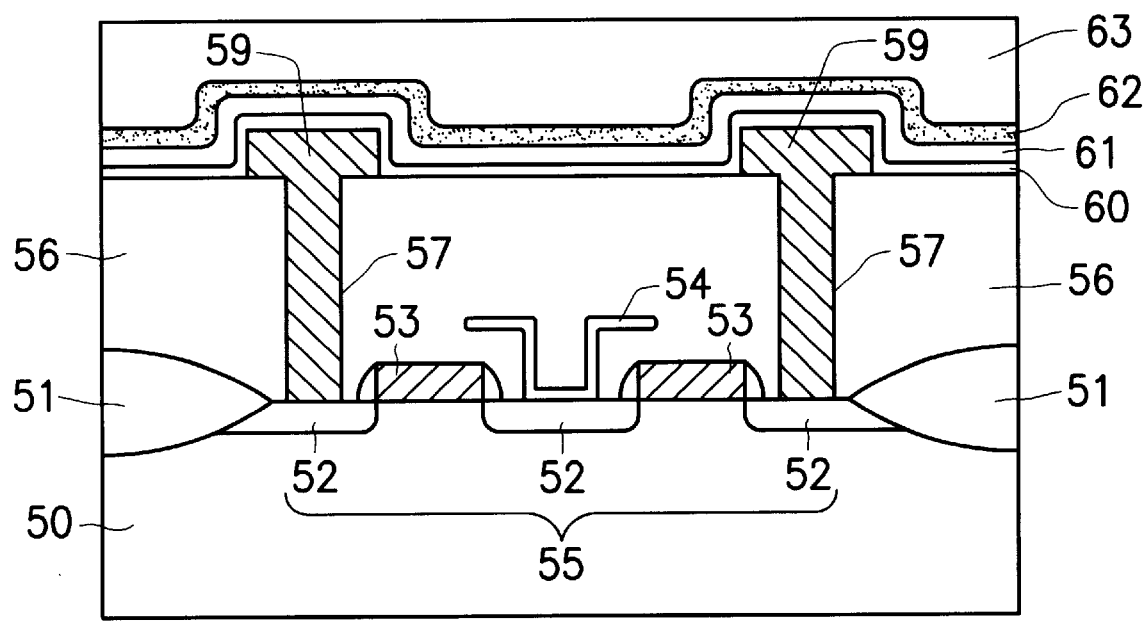

A detailed description of the process of the invention follows with reference to FIGS. 3A–3C, which show the cross-section of a memory cell unit of a DRAM device fabricated in accordance with this invention. Note that these schematic drawings are not presented to the exact physical dimensional scale, as they serve the major purpose of illustrating the process steps of the invention.

Referring to FIG. 3A, a silicon substrate 50 is provided as the basis for the construction of the DRAM device. A field oxide layer 51, polysilicon gate layer 53, source/drain regions 52, and word line 54 of the MOS transistor 55 are formed over the surface of the silicon substrate 50. Then, a chemical vapor deposition procedure, for example, is used to form an oxide layer 56 on the top of the MOS transistor 55. The oxide layer 56 is patterned to form a contact opening 57 over the source/drain regions 52. A conductive layer 58 is deposited over the oxide layer 56 and the contact opening 57. The conductive layer 58 is filled in the contact opening 57. The conductive layer 58 can be, for example, a heavily doped polysilicon layer, a hemispherical grain polysilicon, tungsten, platinum, ruthenium, tungsten nitride, titanium nitride, molybdenum, molybdenum nitride or tantalum nitride.

Referring to FIG. 3B, the conductive layer 58 is patterned to form a plurality of bottom electrodes 59 coupled with the source/drain regions 52 by way of the contact opening 57. A high-k dielectric layer 60, such as a barium strontium titanate, lead zinc titanate or tantalum oxide layer, is deposited over the bottom electrodes 59 and the exposed oxide layer 56. Then, a top electrode 61 is formed on the surface of the high-k dielectric layer 60. The top electrode 61, for example, can be a tungsten, platinum, ruthenium, tungsten nitride, titanium nitride, molybdenum, molybdenum nitride or tantalum nitride layer.

Referring to FIG. 3C, a chemical vapor deposition or a physical vapor deposition procedure, for example, is utilized to deposit a titanium layer 62 on the top of the top electrode 61. The titanium layer 62 and the titanium nitride layer can be formed in the same chamber. Thus, the fabricating cost is reduced. Finally, an interlevel dielectric layer 63, such as a borophosphosilicon glass or phosphosilicon glass layer, is formed over the titanium layer 62. Since the post fabrication steps are not relevant in the context of the invention, they are not elaborated on here.

Resultantly, the stress between the titanium layer 62 and the interlevel dielectric layer 63 is smaller, so that to form the titanium layer 62 between the top electrode layer 61, such as a titanium nitride layer, and the interlevel dielectric layer 63 reduces the stress between the top electrode layer 61 and the interlevel dielectric layer 63. In addition, a titanium oxide layer and a titanium silicide layer are formed between the titanium layer 62 and the interlevel dielectric layer 63 in post thermal procedures. The titanium oxide layer and the titanium silicide layer enhance adhesion and prevent crack formation and leakage current in the interlevel dielectric layer 63.

While the invention has been described by way of example and in terms of a preferred embodiment, it is to be understood that the invention need not be limited to the disclosed embodiment. To the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a DRAM device, comprising:
   forming a transistor including a gate, a source/drain region and a word line on a silicon substrate;
   covering the transistor with an oxide layer,
   forming a contact opening in the oxide layer to expose a surface of the source/drain region;
   forming a conductive layer in the contact opening and covering the oxide layer;
   patterning the conductive layer to form at least one bottom electrode which is coupled with the source/drain region by way of the contact opening;
   forming a dielectric layer over a surface of the bottom electrode and the oxide layer;
   covering the dielectric layer with a top electrode;
   forming a titanium layer on an entire surface of the top electrode; and
   forming an interlevel dielectric layer on the titanium layer, whereby the titanium layer separates the top electrode from the interlevel dielectric layer so that the top electrode is free of any direct contact with the interlevel dielectric layer.

2. The method according to claim 1, wherein said covering the transistor includes forming the oxide layer using chemical vapor deposition.

3. The method according to claim 1, wherein said forming a conductive layer includes forming the conductive layer from a material selected from the group consisting of a heavily doped polysilicon, a hemispherical grain polysilicon, tungsten, platinum, ruthenium, tungsten nitride, titanium nitride, molybdenum, molybdenum nitride and tantalum nitride layer.

4. The method according to claim 1, wherein said forming a dielectric layer includes forming a high-k dielectric layer.

5. The method according to claim 4, wherein the high-k dielectric layer is selected from the group consisting of barium strontium titanate, lead zinc titanate and tantalum oxide.

6. The method according to claim 1, wherein said covering the dielectric layer includes forming the top electrode from a material selected from the group consisting of tungsten, platinum, ruthenium, tungsten nitride, titanium nitride, molybdenum, molybdenum nitride and tantalum nitride.

7. The method according to claim 1, wherein the top electrode and the titanium layer are formed using chemical vapor deposition.

8. The method according to claim 1, wherein the top electrode and the titanium layer are formed using physical vapor deposition.

9. The method according to claim 1, wherein said forming an interlevel dielectric layer includes forming an interlevel dielectric borophosphosilicon glass layer.

10. The method according to claim 1, wherein said forming an interlevel dielectric layer includes forming an interlevel dielectric phosphosilicon glass layer.

11. The method according to claim 1, wherein said patterning includes forming a plurality of bottom electrodes, each being coupled to a respective source/drain region.

12. A method of fabricating a DRAM device, comprising:
    forming a dielectric layer over a surface of a bottom electrode and an oxide layer;
    covering the dielectric layer with a top electrode;
    forming a titanium layer on an entire surface of the top electrode; and
    forming an interlevel dielectric layer on the titanium layer, whereby the titanium layer separates the top electrode from the interlevel dielectric layer so that the top electrode is free of any direct contact with the interlevel dielectric layer.

13. The method according to claim 12, wherein said forming a titanium layer includes using chemical vapor deposition.

14. The method according to claim 12, wherein said forming a titanium layer includes using physical vapor deposition.

15. The method according to claim 12, wherein said forming an interlevel dielectric layer includes forming an interlevel dielectric borophosphosilicon glass layer.

16. The method according to claim 12, wherein said forming an interlevel dielectric layer includes forming an interlevel dielectric phosphosilicon glass layer.

17. The method according to claim 12, wherein said forming a dielectric layer includes forming a dielectric layer directly on and completely covering a surface of a bottom electrode, and covering an oxide layer.

18. The method according to claim 12, wherein the top electrode is free of direct contact with all portions of the bottom electrode.

19. The method of claim 12, further comprising performing a post thermal procedure to form a titanium oxide layer and a titanium silicide layer between the top electrode and the interlevel dielectric layer.

20. The method according to claim 1, wherein said forming a dielectric layer includes forming a dielectric layer directly on and completely covering a surface of the bottom electrode, and covering the oxide layer.

21. The method according to claim 1, wherein the top electrode is free of direct contact with all portions of the bottom electrode.

22. The method of claim 1, further comprising performing a post thermal procedure to form a titanium oxide layer and a titanium silicide layer between the top electrode and the interlevel dielectric layer.

23. The method of claim 1, wherein the forming a titanium layer forms the titanium layer to completely cover the top electrode.

24. The method of claim 12, wherein the forming an interlevel dielectric layer forms the interlevel dielectric layer over the entire titanium layer.

* * * * *